(12) United States Patent
Menard

(10) Patent No.: US 7,262,442 B2
(45) Date of Patent: Aug. 28, 2007

(54) TRIAC OPERATING IN QUADRANTS Q1 AND Q4

(75) Inventor: Samuel Menard, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/013,972

(22) Filed: Dec. 16, 2004

(65) Prior Publication Data

US 2005/0133815 A1 Jun. 23, 2005

(30) Foreign Application Priority Data

Dec. 19, 2003 (FR) .................................. 03 51138

(51) Int. Cl.
*H01L 29/74* (2006.01)
(52) U.S. Cl. ...................... 257/123; 257/153; 257/175; 257/107; 257/E27.052; 257/E29.036; 438/134; 361/100
(58) Field of Classification Search ................ 257/119, 257/134, 123–125, 153, 175, 176; 438/134; 361/100
See application file for complete search history.

(56) References Cited

U.S. PATENT DOCUMENTS

| 4,419,683 | A | * | 12/1983 | Herberg ...................... 257/134 |
| 4,604,638 | A |   | 8/1986  | Matsuda |
| 4,613,884 | A | * | 9/1986  | Angerstein et al. .......... 257/115 |
| 4,939,564 | A | * | 7/1990  | Asakura et al. ............. 257/146 |
| 4,992,844 | A | * | 2/1991  | Yakushiji .................... 257/140 |
| 4,994,884 | A | * | 2/1991  | Kato et al. .................. 257/123 |
| 5,838,110 | A | * | 11/1998 | Pezzani ....................... 315/105 |
| 6,326,648 | B1| * | 12/2001 | Jalade et al. ................ 257/130 |

FOREIGN PATENT DOCUMENTS

| EP | 0 635 889 A1 | 1/1995 |
| JP | 56 148864 | 11/1981 |
| WO | WO 03/056631 A | 7/2003 |

* cited by examiner

*Primary Examiner*—Jerome Jackson
(74) *Attorney, Agent, or Firm*—Lisa K. Jorgenson; James H. Morris; Wolf, Greenfield & Sacks, P.C.

(57) ABSTRACT

A triac including on its front surface side an autonomous starting well of the first conductivity type containing a region of the second conductivity type arranged to divide it, in top view, into a first and a second well portion, the first portion being connected to a control terminal and the second portion being connected with said region to the main front surface terminal.

19 Claims, 2 Drawing Sheets

TRIAC OPERATING IN QUADRANTS Q1 AND Q4

BACKGROUND OF THE INVENTION

1. Field of the Invention

The present invention relates to a triac capable of operating in quadrants Q1 and Q4 and that can, in these quadrants, be turned on by a small gate current Igt, while having a low sensitivity to an unwanted turning-on by a voltage peak (dV/dt turning-on).

2. Discussion of the Related Art

FIG. 1 shows the equivalent diagram of a triac that comprises main terminals A1 and A2 and a gate terminal G referenced to terminal A2. By analogy with a thyristor, there is a tendency to call terminal A1 the anode and terminal A2 the cathode, but it should be noted that in a triac, terminal A1 is intended to be connected to a load, itself connected to a positive or negative A.C. supply voltage with respect to terminal A2. Considering that terminal A2 is grounded, the control quadrants of a triac are defined as follows:

first quadrant (Q1): A1 positive, G positive,
second quadrant (Q2): A1 positive, G negative,
third quadrant (Q3): A1 negative, G negative,
fourth quadrant (Q4): A1 negative, G positive.

FIGS. 2 and 3 respectively show a simplified cross-section view and a simplified top view of an example of a conventional triac. This triac is formed in a lightly-doped N-type substrate 1 surrounded with a heavily-doped P-type insulating wall. The rear surface of the structure essentially comprises a P-type layer 3. On the front surface side is formed a P-type well 5 in which are formed a main N-type region 6 and an auxiliary N-type region 7. On the rear surface side, in layer 3, is formed an N-type region 9 facing the P-type well, mainly in the regions unoccupied by main N-type region 6. The entire rear surface is coated with a metallization M1 intended to be connected to main terminal A1 of the triac. On the front surface side, a main metallization M2, in contact with well 5 and region 6, is intended to be connected to terminal A2 of the triac, generally connected to ground GND. There thus exists a thyristor Th1 formed of regions 3-1-5-6 that can be turned on in quadrants Q1 and Q2 and a thyristor Th2 formed of regions 5-1-3-9 that can be turned on in quadrants Q3 and Q4. Auxiliary N-type region 7 is coated with a metallization M3 intended to be connected to gate terminal G.

An $N^+$-type channel stop ring substantially halfway between the limit of P well 5 and insulating wall 2 has further been shown in FIG. 2. Ring 11 is generally coated with a metallization 12 not connected to an external terminal. Similarly, the component periphery generally comprises a heavily-doped P-type ring 13, formed in insulating wall 2, coated with a metallization 14 unconnected to an external terminal. The portions of the upper silicon surface which are not in contact with a metallization are protected by an insulating layer 16, generally made of silicon oxide, and the entire upper surface, except for the metallization portions to be contacted, is coated with an insulating layer 17, for example, a PSG glass.

In the top view of FIG. 3, the internal portion of channel stop ring 11 has been shown. A portion of substrate 1 appears between the outside of P well 5 and ring 11. The limit of main N-type region 6 and the limit of auxiliary N-type region 7 have also been shown. On the one hand, the area in which metallization M2 is in contact with well 5 and region 6 and, on the other hand, the area in which metallization M3 is in contact on the one hand with the auxiliary gate region, on the other hand with a portion of well 5 (this contact between metallization M3 and a portion of P well 5 is not visible in the cross-section view of FIG. 2), have been shown with dotted lines. It should be reminded that the starting of a triac, which will not be described in detail herein, starts with the flowing of a current between the gate and the cathode along the resistive path designated as $R_{GK}$ in FIG. 3, which causes, after several intermediary steps, the turning-on of that of thyristors Th1 and Th2 which is properly biased.

It is known that such triacs can be relatively easily controlled in quadrants Q1, Q2, and Q3, but operate poorly or not at all in quadrant Q4. Thus, it is not possible to control the gate with a positive signal, whatever the biasing of the main triac terminals. This thus leads to systematically controlling the triacs in quadrants Q2 and Q3, that is, with a negative gate voltage with respect to ground, which makes control circuits more complex.

Further, because of integrated resistor $R_{GK}$ between the gate and the cathode, it is very difficult to obtain structures with a small gate-cathode control current further having good dynamic performance, especially as it relates to positive unwanted triggerings by abrupt voltage variations thereacross (dV/dt turning-on). Indeed, the smaller $R_{GK}$, the higher the insensitivity to a dV/dt turning-on and, however, the higher the control currents must be. This is a disadvantage since it would be desired to be able to easily drive triacs with small currents to be able to, for example, control them directly with a microcontroller. On the other hand, the dV/dt strength is an important parameter to avoid triggerings by unwanted noise, especially in automobile applications.

SUMMARY OF THE INVENTION

Thus, an object of the present invention is to provide a triac which is responsive in quadrants Q1 and Q4, in which the compromise between the gate control current and the dV/dt strength can be optimized.

Another object of the present invention is to provide such a triac which is easy to form with existing technologies.

To achieve these and other objects, the present invention provides a triac comprising on its front surface side an autonomous starting well of the first conductivity type containing a region of the second conductivity type arranged to divide it, in top view, into a first and a second well portion, the first portion being connected to a control terminal and the second portion being connected with said region to the main front surface terminal.

According to an embodiment of the present invention, the auxiliary well is arranged in the immediate vicinity of the main front surface well.

The foregoing objects, features, and advantages of the present invention will be discussed in detail in the following non-limiting description of specific embodiments in connection with the accompanying drawings.

DETAILED DESCRIPTION

As usual in the representation of semiconductor components, the dimensions of the cross-section and top views are not to scale but have been arbitrarily expanded to simplify the drawings and make them more easily readable.

Figure 1:
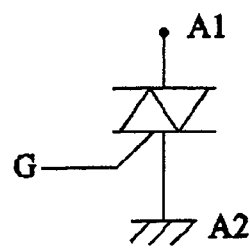
FIG. 1 shows the usual symbol of a triac.
Figure 2:
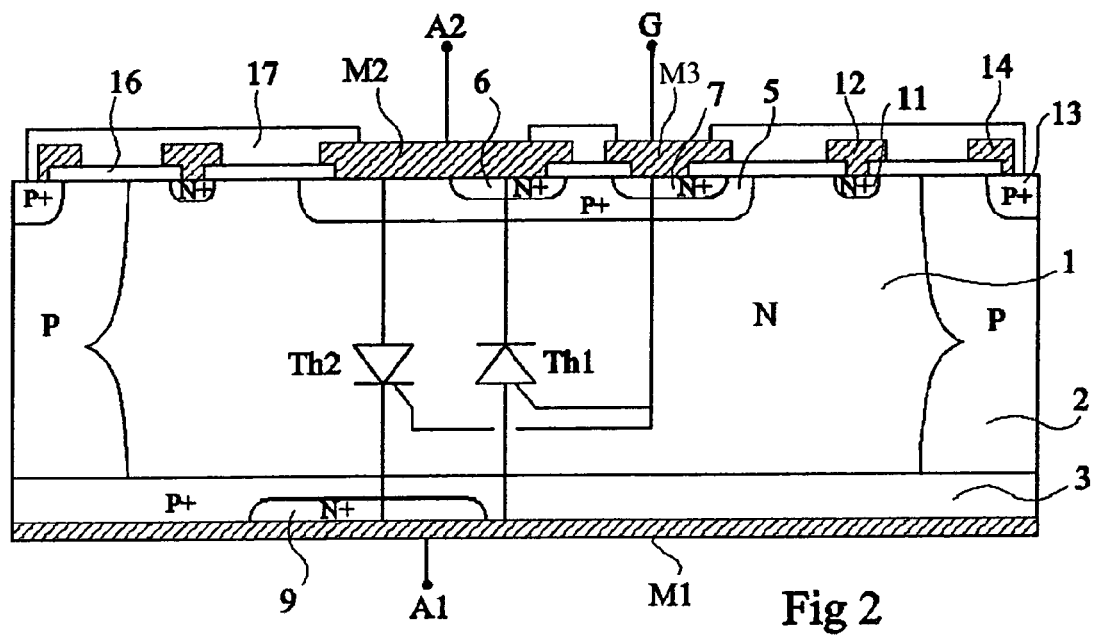
FIG. 2 is a simplified cross-section view of a conventional triac.
Figure 3:
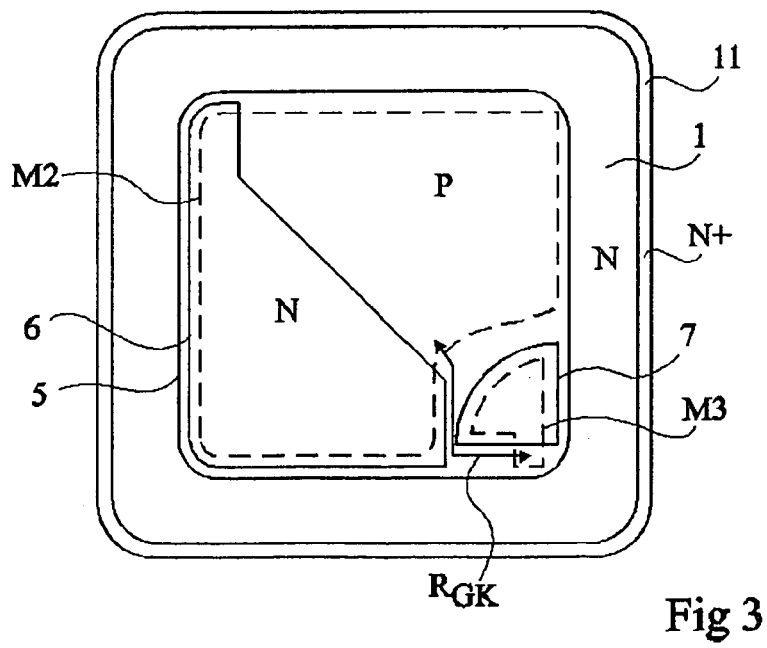
FIG. 3 is a simplified top view of a conventional triac.
Figure 4:
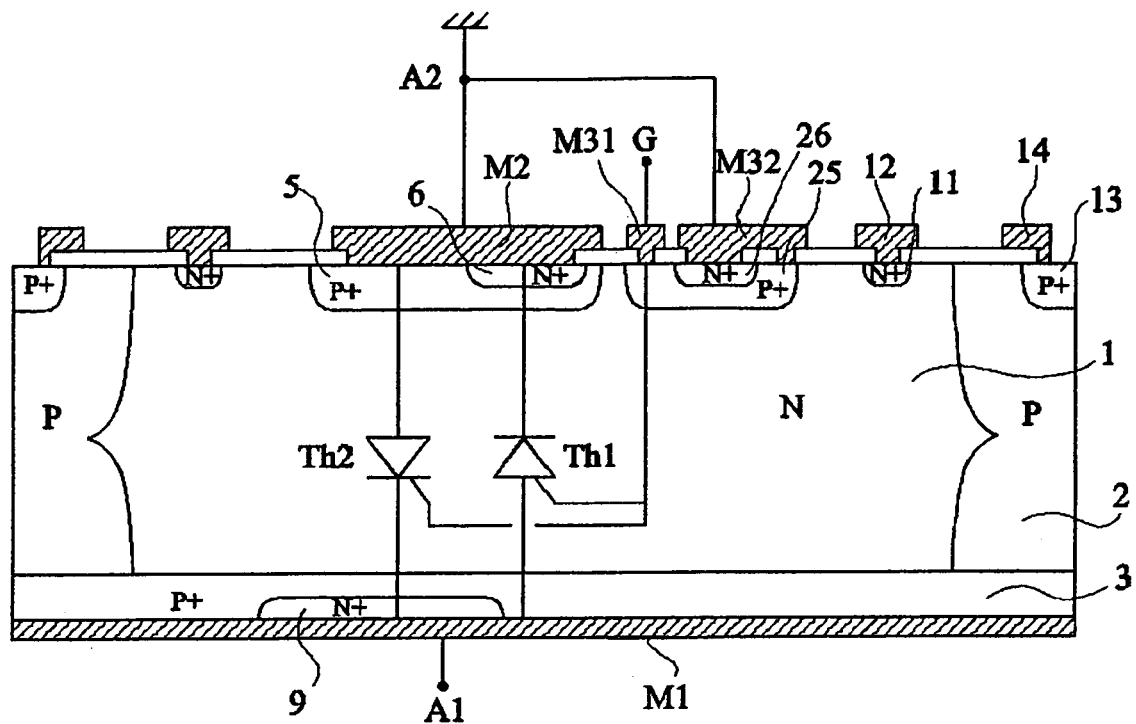
FIG. 4 is a simplified cross-section view of a triac according to the present invention.
Figure 5:
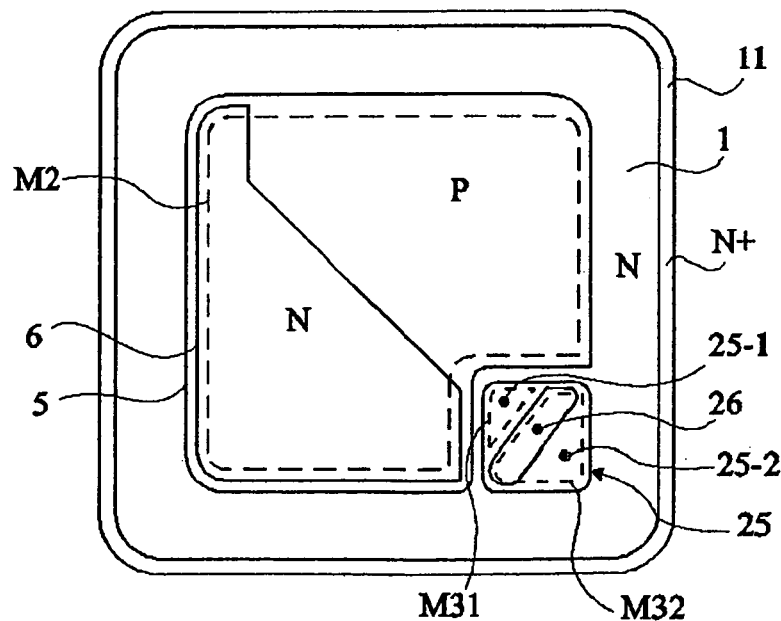
FIG. 5 is a simplified top view of a triac according to the present invention.

FIGS. 4 and 5 show in cross-section view and in top view, in simplified fashion, an embodiment of a triac according to the present invention. In these views, same reference numerals as in FIGS. 2 and 3 are used to designate similar elements which will not be described again. In particular, thyristors Th1 (3-1-5-6) and Th2 (5-1-3-9), connected between metallizations M1 and M2, are present in FIG. 4.

The main difference between the present invention and the state of the art described in relation with FIGS. 2 and 3 lies in the triac starting area. The present invention provides an auxiliary P-type well 25 separate from main P-type well 5 in which main N-type region 6 is formed. In well 25 is formed an auxiliary N-type region 26 shallower than the well. As better shown by the top view of FIG. 5, region 26 extends into well 25 to divide it in top view into a portion 25-1 and a portion 25-2 on either side of region 26.

The upper surface of portion 25-1 of well 25 is coated with a metallization M31, and the upper surfaces of region 26 and of portion 25-2 of well 25 are coated with a metallization M32. Metallization M32 is connected to metallization M2 connected to main terminal A2, currently grounded. In practice, although this has not been shown, metallizations M2 and M32 altogether form one and the same metallization. Metallization M31 is connected to a control terminal or gate terminal G.

When a positive voltage is applied on terminal G with respect to terminal A2, a current flows from terminal G to terminal A2. This current flows through the P-type semiconductor forming P well 25 from portion 25-1, under region 26 to reach portion 25-2. When this current becomes sufficient for the voltage drop to be greater than approximately 0.6 volt, the PN junction between well 25 and region 26 becomes conductive, which results in an injection of electrons into substrate 1. Then, in quadrant Q1, that is, when lower terminal A1 is positive with respect to upper terminal A2, a pilot thyristor formed of regions and layers 3-1-25-26 is started; this starting causes the presence of a great density of carriers in substrate 1, which causes the turning-on of power thyristor Th1. In quadrant Q4, that is, when lower terminal A1 is negative with respect to upper terminal A2, the emission of electrons in the substrate causes the starting of a pilot thyristor formed of regions and layers 25-1-3-9, followed by the starting of power thyristor Th2.

An advantage of the present invention results from the fact that there no longer exists in the starting structure an integrated resistor equivalent to resistor $R_{GK}$ described in relation with FIGS. 2 and 3. Thyristors Th1, Th2 can thus be desensitized with respect to dV/dt startings, for example, by providing emitter short-circuit holes in N-type regions 6 and 9, without for this to have an influence upon the triac turn-on characteristics.

The present invention enables obtaining a significant increase in the turn-on sensitivity in quadrants Q1, Q4. First simulations, non refined, have shown that, all other things being equal, in quadrant Q1, a starting is obtained with the present invention for a 3.9-mA gate current Igt, while with an equivalent conventional structure a current on the order of 6.1 mA had to be provided. Similarly, in quadrant Q4, a 23.1-mA turn-on current Igt can be used instead of a 27-mA current Igt with a prior art structure. This difference is all the more significant as, in the case of a structure according to the present invention, an insensitivity to an unwanted dV/dt turning-on which is substantially twice as strong is obtained. Further, still better results can be expected by optimizing the structures. First simulations show that an improvement of more than 50% should be obtained.

Of course, the present invention is likely to have various, alterations, improvements, and modifications which will readily occur to those skilled in the art. In particular, various modifications generally provided in conventional triacs may easily adapt to a triac according to the present invention.

On the other hand, the topographies of the various layers may be modified. In particular, the rectangular shape of the turn-on area shown in FIG. 5 is an example only of embodiment of the present invention. What matters is that the auxiliary P well intended for the turning-on comprises an N region which, in top view, substantially separates it in two portions so that the current from one to the other of the two portions must flow into the well under the N region and can turn on the PN junction between the N region and the P well.

An advantage of the structure according to the present invention is that, main and auxiliary P wells 5 and 25 both being at the same potential, they can be arranged very close to each other without it being necessary to provide a large distance of N substrate therebetween. Indeed, since they are at the same potential, a self-shielding phenomenon occurs and the field lines are not likely, if these wells are close enough, to penetrate into the region interposed between the two wells. Thus, the structure according to the present invention causes no significant increase in the surface area dedicated to the gate region of the component. It does not require either a specific manufacturing step to form the gate area and/or to isolate other elements of the component.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A triac comprising on its front surface an autonomous starting well of a first conductivity type containing a region of a second conductivity type arranged to divide the starting well, in top view, into a first and a second well portion, the first portion being connected to a control terminal and the second portion being connected with said region to a main front surface terminal.

2. The triac of claim 1, wherein the starting well is an auxilliary well that is arranged in the immediate vicinity of a main front surface well.

3. A triac, comprising;
    a first well coupled to a first terminal of the triac; and
    a second well coupled to the first terminal of the triac and to a control terminal of the triac;
    wherein the second well comprises a second region of a first conductivity type and the control terminal of the triac corn rises a second metallization that contacts the second region of the first conductivity type;
    wherein the first terminal of the triac further comprises a third metallization that contacts the second region of the first conductivity type.

4. The triac of claim 3, wherein the first well comprises a first region of a first conductivity type and the first terminal of the triac comprises a first metallization that contacts the first region of the first conductivity type.

5. The triac of claim 4, wherein the first conductivity type is type P.

6. The triac of claim 3, wherein the second well further comprises a first region of a second conductivity type that contacts the third metallization.

7. The triac of claim 6, wherein the first region of the second conductivity type is disposed within the second region of the first conductivity type.

8. The triac of claim 6, wherein the first region of the second conductivity type contacts the third metallization closer to the second metallization than the second region of the first conductivity type contacts the third metallization.

9. The triac of claim 6, wherein the first region of the second conductivity type contacts the third metallization approximately along a diagonal of an approximately rectangular region formed by the second region of the first conductivity type.

10. The triac of claim 3, wherein the first well is a main well of the triac and the second well is an auxiliary starting well of the triac.

11. The triac of claim 3, wherein the second well is an autonomous starting well of a first conductivity type comprising a region of a second conductivity type arranged to divide the starting well, in top view, into a first and second well portion, the first portion being coupled to a control terminal and the second portion being coupled with the second region to a main front surface terminal.

12. A triac, comprising:
a control terminal;
a first well coupled to a first terminal of the triac; and
a second well coupled to the first terminal of the triac such that the second well turns on the triac in response to a positive voltage being applied to the control terminal;
wherein the second well comprises a second region of a first conductivity type and the control terminal of the triac comprises a second metallization that contacts the second region of the first conductivity type;
wherein the first terminal of the triac further comprises a third metallization that contacts the second region of the first conductivity type.

13. The triac of claim 12, wherein the first well comprises a first region of a first conductivity type and the first terminal of the triac comprises a first metallization that contacts the first region of the first conductivity type.

14. The triac of claim 12, wherein the second well further comprises a first region of a second conductivity type that contacts the third metallization.

15. The triac of claim 14, wherein the first region of the second conductivity type is disposed within the second region of the first conductivity type.

16. The triac of claim 14, wherein the first region of the second conductivity type contacts the third metallization closer to the second metallization than the second region of the first conductivity type contacts the third metallization.

17. The triac of claim 14, wherein the first region of the second conductivity type contacts the third metallization approximately along a diagonal of an approximately rectangular region formed by the second region of the first conductivity type.

18. The triac of claim 12, wherein the first well is a main well of the triac and the second well is an auxiliary starting well of the triac.

19. The triac of claim 12, wherein the second well is an autonomous starring well of a first conductivity type comprising a region of a second conductivity type arranged to divide the starting well, in top view, into a first and second well portion, the first portion being coupled to a control terminal and the second portion being coupled with the second region to a main front surface terminal.

* * * * *

UNITED STATES PATENT AND TRADEMARK OFFICE
CERTIFICATE OF CORRECTION

PATENT NO. : 7,262,442 B2
APPLICATION NO. : 11/013972
DATED : August 28, 2007
INVENTOR(S) : Samuel Menard It is certified that error appears in the above-identified patent and that said Letters Patent is hereby corrected as shown below:

Claim 3, col. 4, line 57 should read:
triac comprises a second metallization that contacts the Claim 19, col. 6, line 28 should read:
autonomous starting well of a first conductivity type com Signed and Sealed this Sixth Day of November, 2007

JON W. DUDAS
*Director of the United States Patent and Trademark Office*